(12) United States Patent
Lung

(10) Patent No.: US 7,786,461 B2
(45) Date of Patent: Aug. 31, 2010

(54) MEMORY STRUCTURE WITH REDUCED-SIZE MEMORY ELEMENT BETWEEN MEMORY MATERIAL PORTIONS

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 489 days.

(21) Appl. No.: 11/695,667

(22) Filed: Apr. 3, 2007

(65) Prior Publication Data
US 2008/0246014 A1  Oct. 9, 2008

(51) Int. Cl.
*H01L 47/00* (2006.01)
(52) U.S. Cl. .................................. 257/2; 257/E45.002
(58) Field of Classification Search ................. 257/2–4, 257/E45.002
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 4,452,592 | A | 6/1984 | Tsai |
| 4,599,705 | A | 7/1986 | Holmberg et al. |
| 4,719,594 | A | 1/1988 | Young et al. |
| 4,769,339 | A | 9/1988 | Ishii et al. |
| 4,876,220 | A | 10/1989 | Mohsen et al. |
| 4,959,812 | A | 9/1990 | Momodomi et al. |
| 5,106,775 | A | 4/1992 | Kaga et al. |
| 5,166,096 | A | 11/1992 | Cote et al. |
| 5,166,758 | A | 11/1992 | Ovshinsky et al. |
| 5,177,567 | A | 1/1993 | Klersy et al. |
| 5,332,923 | A | 7/1994 | Takeuchi et al. |
| 5,391,901 | A | 2/1995 | Tanabe et al. |
| 5,515,488 | A | 5/1996 | Hoppe et al. |
| 5,534,712 | A | 7/1996 | Ovshinsky et al. |
| 5,550,396 | A | 8/1996 | Tsutsumi et al. |

(Continued)

FOREIGN PATENT DOCUMENTS

CN    1462478    12/2003

(Continued)

OTHER PUBLICATIONS

English language translation of Korean patent publication 10-2006-0079455 to Hwang, Nov. 2009.*

(Continued)

*Primary Examiner*—Mark Prenty
(74) *Attorney, Agent, or Firm*—James F. Hann; Haynes Beffel & Wolfeld LLP

(57) ABSTRACT

A memory cell device includes a memory cell access layer, a dielectric material over the memory cell access layer, a memory material structure within the dielectric material, and a top electrode in electrical contact with the memory material structure. The memory material structure has upper and lower memory material portions and a memory material element therebetween. The lower memory material layer is in electrical contact with a bottom electrode. The lower memory material layer has an average lateral dimension. The memory material element defines an electrical property state change region therein and has a minimum lateral dimension which is substantially less than the average lateral dimension. In some examples the memory material element is a tapered structure with the electrical property state change region at the junction of the memory material element and the lower memory material layer.

13 Claims, 14 Drawing Sheets

U.S. PATENT DOCUMENTS

| | | |
|---|---|---|
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,746,892 B2 | 6/2004 | Lee et al. |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,791,859 B2 | 9/2004 | Hush et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi et al. |
| 6,808,991 B1 | 10/2004 | Tung et al. |
| 6,815,704 B1 | 11/2004 | Chen |
| 6,830,952 B2 | 12/2004 | Lung et al. |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |

| | | | | | |
|---|---|---|---|---|---|
| 7,078,273 B2 | 7/2006 | Matsuoka et al. | 2005/0263829 A1 | 12/2005 | Song et al. |
| 7,099,180 B1 | 8/2006 | Dodge et al. | 2006/0006472 A1 | 1/2006 | Jiang |
| 7,115,927 B2 | 10/2006 | Hideki et al. | 2006/0038221 A1 | 2/2006 | Lee et al. |
| 7,122,281 B2 | 10/2006 | Pierrat | 2006/0066156 A1 | 3/2006 | Dong et al. |
| 7,122,824 B2 | 10/2006 | Khouri et al. | 2006/0073642 A1 | 4/2006 | Yeh et al. |
| 7,126,149 B2 | 10/2006 | Iwasaki et al. | 2006/0091476 A1 | 5/2006 | Pinnow et al. |
| 7,132,675 B2 | 11/2006 | Gilton | 2006/0094154 A1 | 5/2006 | Lung |
| 7,151,273 B2 | 12/2006 | Campbell et al. | 2006/0108667 A1 | 5/2006 | Lung |
| 7,154,774 B2 | 12/2006 | Bedeschi et al. | 2006/0110878 A1 | 5/2006 | Lung et al. |
| 7,158,411 B2 | 1/2007 | Yeh et al. | 2006/0110888 A1 | 5/2006 | Cho et al. |
| 7,164,147 B2 | 1/2007 | Lee et al. | 2006/0113520 A1 | 6/2006 | Yamamoto et al. |
| 7,166,533 B2 | 1/2007 | Happ | 2006/0113521 A1 | 6/2006 | Lung |
| 7,169,635 B2 | 1/2007 | Kozicki | 2006/0118913 A1 | 6/2006 | Yi et al. |
| 7,202,493 B2 | 4/2007 | Lung et al. | 2006/0124916 A1 | 6/2006 | Lung |
| 7,208,751 B2 | 4/2007 | Ooishi et al. | 2006/0126395 A1 | 6/2006 | Chen et al. |
| 7,214,958 B2 | 5/2007 | Happ | 2006/0131555 A1 | 6/2006 | Liu et al. |
| 7,220,983 B2 | 5/2007 | Lung | 2006/0138467 A1 | 6/2006 | Lung |
| 7,229,883 B2 | 6/2007 | Wang et al. | 2006/0154185 A1 | 7/2006 | Ho et al. |
| 7,238,959 B2 | 7/2007 | Chen | 2006/0157681 A1 | 7/2006 | Chen et al. |
| 7,238,994 B2 | 7/2007 | Chen et al. | 2006/0163554 A1 | 7/2006 | Lankhorst et al. |
| 7,248,494 B2 | 7/2007 | Oh et al. | 2006/0172067 A1 | 8/2006 | Ovshinsky et al. |
| 7,251,157 B2 | 7/2007 | Osada et al. | 2006/0175599 A1 | 8/2006 | Happ |
| 7,253,429 B2 | 8/2007 | Klersy et al. | 2006/0198183 A1 | 9/2006 | Kawahara et al. |
| 7,254,059 B2 | 8/2007 | Li et al. | 2006/0205108 A1 | 9/2006 | Maimon et al. |
| 7,269,052 B2 | 9/2007 | Segal et al. | 2006/0211165 A1 | 9/2006 | Hwang et al. |
| 7,277,317 B2 | 10/2007 | Le Phan et al. | 2006/0226409 A1 | 10/2006 | Burr et al. |
| 7,291,556 B2 | 11/2007 | Choi et al. | 2006/0234138 A1 | 10/2006 | Fehlhaber et al. |
| 7,309,630 B2 | 12/2007 | Fan et al. | 2006/0237756 A1 | 10/2006 | Park et al. |
| 7,321,130 B2 | 1/2008 | Lung et al. | 2006/0245236 A1 | 11/2006 | Zaidi |
| 7,323,708 B2 | 1/2008 | Lee et al. | 2006/0250885 A1 | 11/2006 | Cho et al. |
| 7,332,370 B2 | 2/2008 | Chang et al. | 2006/0261392 A1 | 11/2006 | Lee et al. |
| 7,336,526 B2 | 2/2008 | Osada et al. | 2006/0266993 A1 | 11/2006 | Suh et al. |
| 7,351,648 B2 | 4/2008 | Furukawa et al. | 2006/0281216 A1 | 12/2006 | Chang et al. |
| 7,359,231 B2 | 4/2008 | Venkataraman et al. | 2006/0284157 A1 | 12/2006 | Chen et al. |
| 7,364,935 B2 | 4/2008 | Lung et al. | 2006/0284158 A1 | 12/2006 | Lung et al. |
| 7,365,385 B2 | 4/2008 | Abbott | 2006/0284214 A1 | 12/2006 | Chen |
| 7,379,328 B2 | 5/2008 | Osada et al. | 2006/0284279 A1 | 12/2006 | Lung et al. |
| 7,385,235 B2 | 6/2008 | Lung et al. | 2006/0286709 A1 | 12/2006 | Lung et al. |
| 7,394,088 B2 | 7/2008 | Lung | 2006/0286743 A1 | 12/2006 | Lung et al. |
| 7,397,060 B2 | 7/2008 | Lung | 2006/0289848 A1 | 12/2006 | Dennison |
| 7,423,300 B2 | 9/2008 | Lung et al. | 2007/0008786 A1 | 1/2007 | Scheuerlein |
| 7,426,134 B2 | 9/2008 | Happ et al. | 2007/0010054 A1 | 1/2007 | Fan et al. |
| 7,440,308 B2 | 10/2008 | Jeong et al. | 2007/0030721 A1 | 2/2007 | Segal et al. |
| 7,449,710 B2 | 11/2008 | Lung | 2007/0037101 A1 | 2/2007 | Morioka |
| 7,473,576 B2 | 1/2009 | Lung | 2007/0096162 A1 | 5/2007 | Happ et al. |
| 7,479,649 B2 | 1/2009 | Lung | 2007/0096248 A1 | 5/2007 | Philipp et al. |
| 7,507,986 B2 | 3/2009 | Lung | 2007/0108077 A1 | 5/2007 | Lung et al. |
| 7,514,334 B2 | 4/2009 | Chen et al. | 2007/0108429 A1 | 5/2007 | Lung |
| 7,515,461 B2 | 4/2009 | Happ et al. | 2007/0108430 A1 | 5/2007 | Lung |
| 2002/0070457 A1 | 6/2002 | Sun et al. | 2007/0108431 A1 | 5/2007 | Chen et al. |
| 2002/0113273 A1 | 8/2002 | Hwang et al. | 2007/0109836 A1 | 5/2007 | Lung |
| 2003/0072195 A1 | 4/2003 | Mikolajick | 2007/0109843 A1 | 5/2007 | Lung et al. |
| 2003/0095426 A1 | 5/2003 | Hush et al. | 2007/0111429 A1 | 5/2007 | Lung |
| 2003/0186481 A1 | 10/2003 | Lung | 2007/0115794 A1 | 5/2007 | Lung |
| 2004/0026686 A1 | 2/2004 | Lung | 2007/0117315 A1 | 5/2007 | Lai et al. |
| 2004/0051094 A1 | 3/2004 | Ooishi | 2007/0120104 A1 | 5/2007 | Ahn et al. |
| 2004/0113137 A1 | 6/2004 | Lowrey | 2007/0121363 A1 | 5/2007 | Lung |
| 2004/0165422 A1 | 8/2004 | Hideki et al. | 2007/0121374 A1 | 5/2007 | Lung et al. |
| 2004/0248339 A1 | 12/2004 | Lung | 2007/0126040 A1 | 6/2007 | Lung |
| 2004/0256610 A1 | 12/2004 | Lung | 2007/0131922 A1 | 6/2007 | Lung |
| 2005/0018526 A1 | 1/2005 | Lee | 2007/0131980 A1 | 6/2007 | Lung |
| 2005/0029502 A1 | 2/2005 | Hudgens | 2007/0138458 A1 | 6/2007 | Lung |
| 2005/0052904 A1 | 3/2005 | Cho et al. | 2007/0147105 A1 | 6/2007 | Lung et al. |
| 2005/0062087 A1 | 3/2005 | Chen et al. | 2007/0153563 A1 | 7/2007 | Nirschl |
| 2005/0093022 A1 | 5/2005 | Lung | 2007/0154847 A1 | 7/2007 | Chen et al. |
| 2005/0127349 A1 | 6/2005 | Horak et al. | 2007/0155172 A1 | 7/2007 | Lai et al. |
| 2005/0145984 A1 | 7/2005 | Chen et al. | 2007/0156949 A1 | 7/2007 | Rudelic et al. |
| 2005/0167656 A1 | 8/2005 | Sun et al. | 2007/0158632 A1 | 7/2007 | Ho |
| 2005/0191804 A1 | 9/2005 | Lai et al. | 2007/0158633 A1 | 7/2007 | Lai et al. |
| 2005/0201182 A1 | 9/2005 | Osada et al. | 2007/0158645 A1 | 7/2007 | Lung |
| 2005/0212024 A1 | 9/2005 | Happ | 2007/0158690 A1 | 7/2007 | Ho et al. |
| 2005/0212026 A1 | 9/2005 | Chung et al. | 2007/0158862 A1 | 7/2007 | Lung |
| 2005/0215009 A1 | 9/2005 | Cho | 2007/0161186 A1 | 7/2007 | Ho |

| | | | |
|---|---|---|---|
| 2007/0170881 A1 | 7/2007 | Noh et al. | |
| 2007/0173019 A1 | 7/2007 | Ho et al. | |
| 2007/0173063 A1 | 7/2007 | Lung | |
| 2007/0176261 A1 | 8/2007 | Lung | |
| 2007/0187664 A1 | 8/2007 | Happ | |
| 2007/0201267 A1 | 8/2007 | Happ et al. | |
| 2007/0215852 A1 | 9/2007 | Lung | |
| 2007/0224726 A1 | 9/2007 | Chen et al. | |
| 2007/0235811 A1 | 10/2007 | Furukawa et al. | |
| 2007/0236989 A1 | 10/2007 | Lung | |
| 2007/0246699 A1 | 10/2007 | Lung | |
| 2007/0249090 A1 | 10/2007 | Philipp et al. | |
| 2007/0257300 A1 | 11/2007 | Ho et al. | |
| 2007/0262388 A1 | 11/2007 | Ho et al. | |
| 2007/0267618 A1 | 11/2007 | Zaidi et al. | |
| 2007/0274121 A1 | 11/2007 | Lung et al. | |
| 2007/0285960 A1 | 12/2007 | Lung et al. | |
| 2007/0298535 A1 | 12/2007 | Lung | |
| 2008/0006811 A1 | 1/2008 | Philipp et al. | |
| 2008/0012000 A1 | 1/2008 | Harshfield | |
| 2008/0014676 A1 | 1/2008 | Lung et al. | |
| 2008/0025089 A1 | 1/2008 | Scheuerlein et al. | |
| 2008/0043520 A1 | 2/2008 | Chen | |
| 2008/0094871 A1 | 4/2008 | Parkinson | |
| 2008/0101110 A1 | 5/2008 | Happ et al. | |
| 2008/0137400 A1 | 6/2008 | Chen et al. | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0224119 A1 | 9/2008 | Burr et al. | |
| 2008/0225489 A1 | 9/2008 | Cai et al. | |
| 2008/0246014 A1* | 10/2008 | Lung | 257/4 |
| 2008/0265234 A1 | 10/2008 | Breitwisch et al. | |
| 2009/0001341 A1 | 1/2009 | Breitwisch et al. | |
| 2009/0014704 A1 | 1/2009 | Chen et al. | |
| 2009/0023242 A1 | 1/2009 | Lung | |
| 2009/0027950 A1 | 1/2009 | Lam et al. | |
| 2009/0042335 A1 | 2/2009 | Lung | |
| 2009/0057641 A1 | 3/2009 | Lung | |

FOREIGN PATENT DOCUMENTS

| | | | |
|---|---|---|---|
| KR | 1020060079455 | * | 7/2006 |
| WO | 0079539 | | 12/2000 |
| WO | 0145108 | | 6/2001 |
| WO | 0225733 | | 3/2002 |

OTHER PUBLICATIONS

Axon Technologies Corporation paper: Technology Description, published in 1997, pp. 1-6.

Gleixner, "Phase Change Memory Reliability", 22nd NVSMW, Aug. 26, 2007, 46 pages.

Yamada, Noboru, "Potential of Ge-Sb-Te phase-change optical disks for high-data-rate recording in the near future," (Conference Proceedings Paper), Jul. 30, 1997, vol. 3109, 10 pages.

Adler, David, "Amorphous-Semiconductor Devices," Sci. Amer., vol. 236, pp. 36-48, May 1977.

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24?m-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martin H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

"Optimized Thermal Capacitance in a Phase Change Memory Cell Design", IPCOM000141986D, IP.com Prior Art Database, Oct. 18, 2006, 4 pp.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Non-volatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, 'http://klabs.org/richcontent/MAPLDCon99/Papers/P21_Tyson_P.PDF#search=nonvolatile% 20high%20density%20high%20performance%20phase%20change%20memory <http://klabs.org/richcontent/MAPLDCon99/Papers/P21_Tyson_P.PDF#search='nonvolatile%20high% 20density%20high%20performance%20phase%20change%20memory>', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

Atwood, G, et al., "90nm Phase Change Technology with mTrench and Lance Cell Elements," VLSI Technology, Systems and Applications, Apr. 23-25, 2007, pp. 1-2.

Chao, D-S. et al., "Low Programming Current Phase Change Memory Cell with Double gst Thermally Confined Structure," VLSI-TSA 2007, International symposium Apr. 23-25, 2007, 2pp.

* cited by examiner

MEMORY STRUCTURE WITH REDUCED-SIZE MEMORY ELEMENT BETWEEN MEMORY MATERIAL PORTIONS

CROSS-REFERENCE TO OTHER APPLICATIONS

This application is related to U.S. patent application Ser. No. 11/352,755, filed 13 Feb. 2006, entitled THERMALLY INSULATED PHASE CHANGE MEMORY DEVICE AND MANUFACTURING METHOD, U.S. patent application Ser. No. 11/677,416, filed 21 Feb. 2007 entitled PHASE CHANGE MEMORY CELL WITH HEATER AND METHOD FOR FABRICATING THE SAME, and U.S. patent application Ser. No. 11/677,416.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on memory materials, for example resistor random access memory (RRAM) devices, and to methods for manufacturing such devices. The memory material is switchable between electrical property states by the application of energy. The memory materials may be phase change based memory materials, including chalcogenide based materials, and other materials.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

In phase change memory, data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell. One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

Accordingly, an opportunity arises to devise methods and structures that form memory cells with structures that have small active regions of programmable resistive material using reliable and repeatable manufacturing techniques.

BRIEF SUMMARY OF THE INVENTION

An example of a memory cell device, of the type including a memory material switchable between electrical properties states by the application of energy, includes a memory cell access layer, a dielectric material over the memory cell access layer, a memory material structure within the dielectric material, and a top electrode in electrical contact with the memory material structure. The memory cell access layer comprises a bottom electrode, the bottom electrode having a bottom electrode surface. The memory material structure comprises upper and lower memory material portions and a memory material element. The lower memory material layer overlies at least a substantial portion of the bottom electrode surface and is in electrical contact with the bottom electrode. The lower memory material layer has an average lateral dimension. The upper memory material portion overlies at least a substantial portion of the lower memory material layer. The memory material element electrically connects the upper memory material portion with the lower memory material layer. The memory material element defines an electrical property state change region therein. The memory material element has a minimum lateral dimension which is substantially less than the average lateral dimension. The top electrode is an electrical contact with the upper memory material portion. In some examples the memory material element is a tapered structure tapering down to a smaller cross-sectional area adjacent to the memory material layer, whereby the electrical property state change region is at the junction of the memory material element and the lower memory material layer.

An example of a method for making a memory cell device, of the type including a memory material switchable between electrical properties states by the application of energy, includes the following steps. A subassembly, comprising a memory cell access layer and a dielectric material over the memory cell access layer, is provided. The memory cell access layer comprises a bottom electrode. An opening is formed through the dielectric material to expose the bottom electrode. A first memory material is deposited into the opening to form a memory material layer in electrical contact with the bottom electrode. A dielectric material is deposited into the opening in a manner to create a void therein. The dielectric material within the opening is etched to create an etched opening. The etched opening comprises a larger, upper open region and a smaller, constricted lower open region, the constricted lower open region being adjacent to the memory material layer. A second memory material is deposited into the opening to create a memory material structure by: (1) at least substantially filling the constricted lower open region to create a memory material element within the constricted lower open region, the memory material element electrically contacting the memory material layer, and (2) at least partially filling the upper open region to create an upper memory material portion within the upper open region, the memory material structure comprising the memory material layer, the memory material element and the upper memory material portion. A top electrode is formed in electrical contact with the upper memory material portion. In some examples the dielectric material etching step is carried out to create a tapered constricted lower open region tapering down to a smaller cross-sectional area adjacent to the memory material layer, whereby a phase change region is created at the junction of the memory material element and the memory material layer.

Other features, aspects and advantages of the present invention can be seen on review the figures, the detailed description, and the claims which follow.

DETAILED DESCRIPTION OF THE INVENTION

Figure 1:
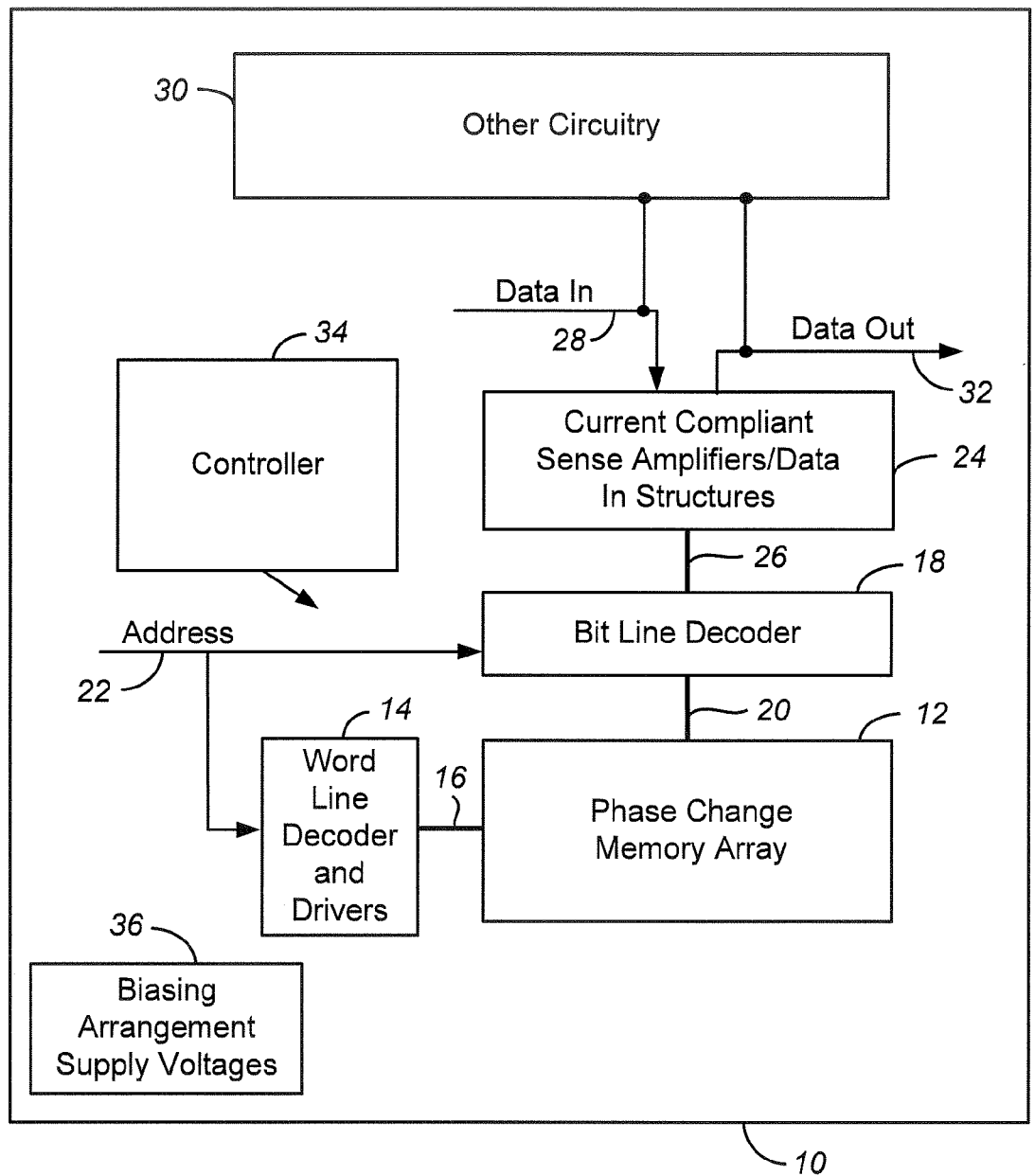
FIG. 1 is a block diagram of one example of an integrated circuit device.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Referring to FIG. 1, shown is a simplified block diagram of an integrated circuit 10 in which the present invention may be implemented. Circuit 10 includes a memory array 12 implemented using phase change memory cells (not shown) on a semiconductor substrate, discussed more fully below. A word line decoder 14 is in electrical communication with a plurality of word lines 16. A bit line decoder 18 is in electrical communication with a plurality of bit lines 20 to read data from, and write data to, the phase change memory cells (not shown) in array 12. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 2:
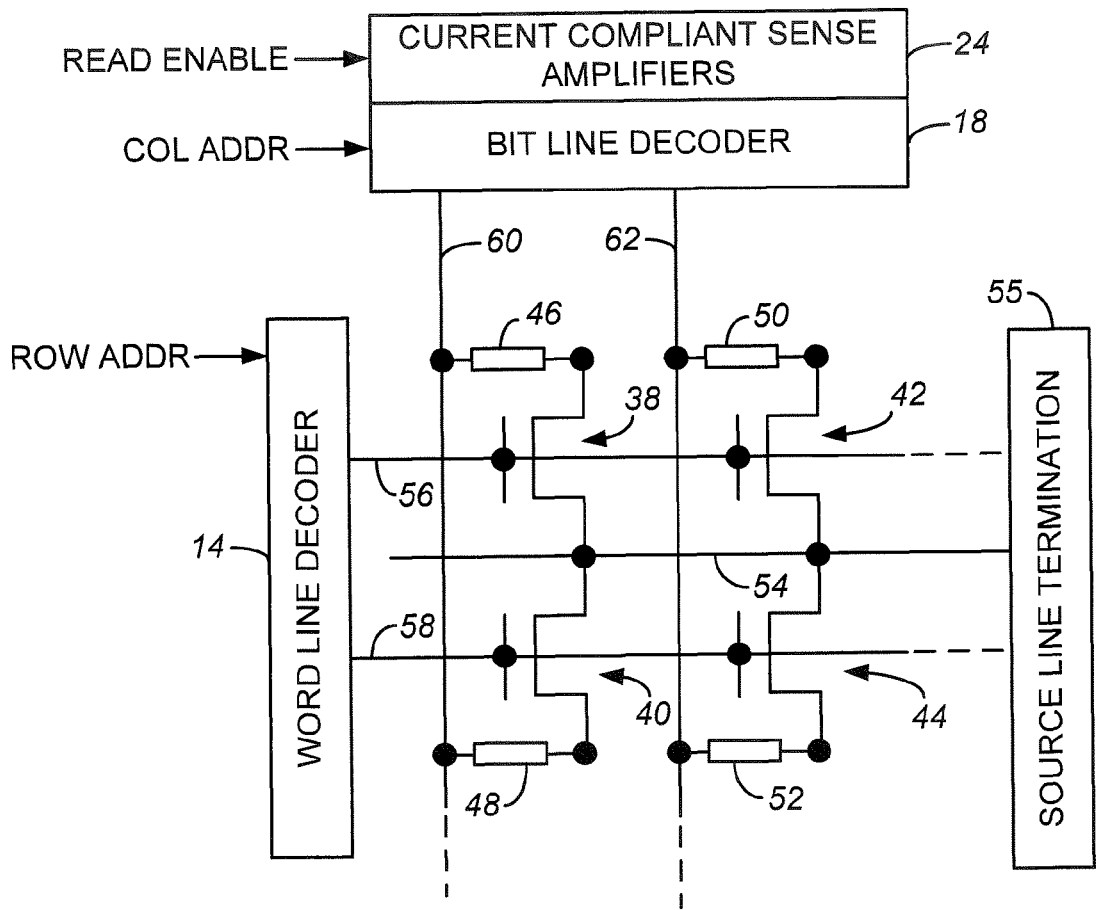
FIG. 2 is a partial schematic diagram of a representative memory array as shown in FIG. 1.

As shown in FIG. 2 each of the memory cells of array 12 includes an access transistor (or other access device such as a diode), four of which are shown as 38, 40, 42 and 44, and a phase change element, shown as 46, 48, 50 and 52. Sources of each of access transistors 38, 40, 42 and 44 are connected in common to a source line 54 that terminates in a source line termination 55. In another embodiment the source lines of the select devices are not electrically connected, but independently controllable. A plurality 16 of word lines including word lines 56 and 58 extend parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality 20 of bit lines including bit lines 60 and 62 have one end of phase change elements 46 and 48 connected to bit line 60. Specifically, phase change element 46 is connected between the drain of access transistor 38 and bit line 60, and phase change element 48 is connected between the drain of access transistor 48 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other array structures may be used, e.g. the phase change memory element is connected to source.

Figure 3:
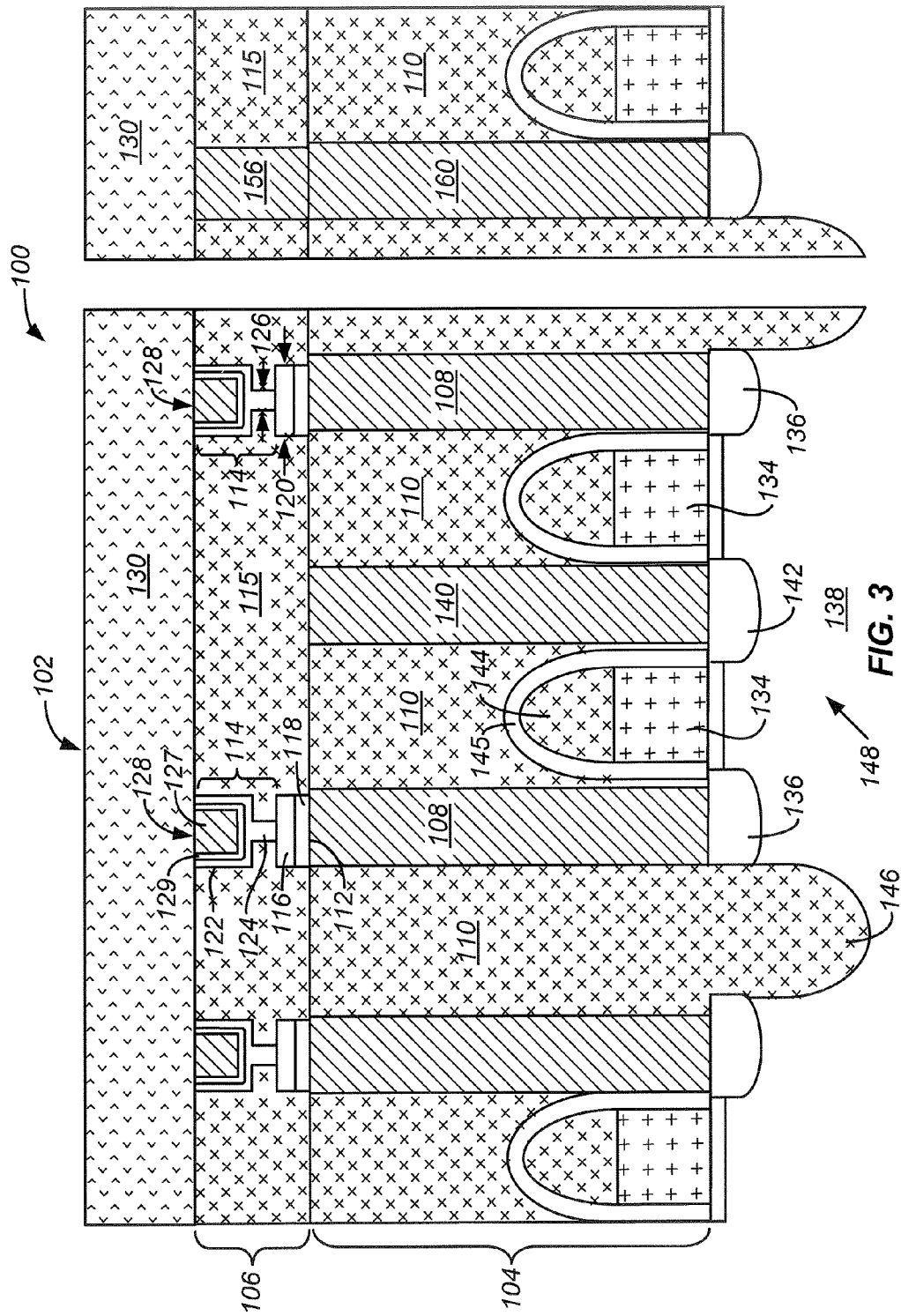
FIG. 3 is a simplified view of an example of a memory cell array including memory cell devices.
Figure 3A:
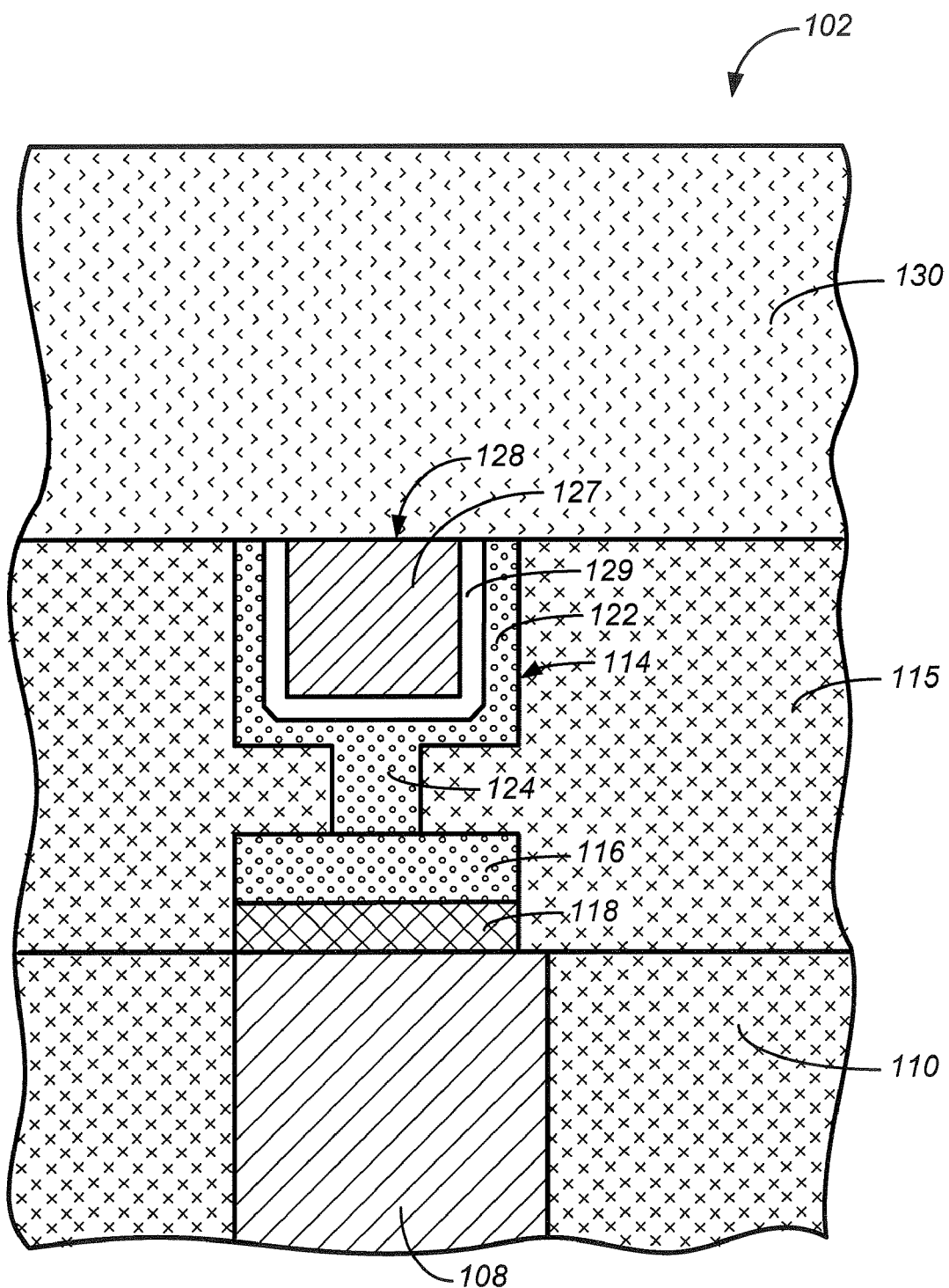
FIG. 3A is an enlarged view of a portion of a memory cell device of FIG. 3.

FIGS. 3 and 3A show an example of a memory cell array 100 comprising memory cell devices 102, each memory cell device including a memory cell access layer 104 and a memory cell layer 106. Memory cell access layer 104 includes a plug or contact 108 within a dielectric fill layer 110. Contact 108 has a surface 112 adjacent to memory cell layer 106. Memory cell layer 106 includes a memory material structure 114 within a dielectric material 115. Memory material structure 114 includes a lower memory material layer 116 in electrical contact with surface 112 through a bottom electrode 118.

In this example memory material structure comprises a phase change material while contact 108 comprises tungsten. It is preferred that an electrically conductive bottom electrode 118 be used between lower memory material layer 116 and a surface 112 for enhanced compatibility between the contact 108 and the phase change material of lower memory material layer 116. In this example bottom electrode 118 is made of TiN.

In this example a surface 112, bottom electrode 118 and lower memory material layer 116 all have substantially the same average lateral dimension 120. This helps to ensure good electrical contact between memory material structure 114 and contact 108. Memory material structure 114 also includes an upper memory material portion 122, having a lateral dimension similar to lateral dimension 120, and a memory material element 124 between lower memory material layer 116 and upper memory material portion 122. Memory material element 124 has a minimum lateral dimension 126. Minimum lateral dimension 126 is preferably a sub lithographic dimension and is substantially less than average level dimension 120 so that the electrical property state change region 132 (identified in FIG. 4), typically a phase change region, within the memory material structure is at least partially defined within memory material element 124. Average lateral dimension 120 is typically at least 3 times, and is preferably at least 4 times, minimum lateral dimension 126. Average lateral dimension 120 is typically about 20 nm to 90 nm and is preferably about 60 nm. Minimum lateral dimension 126 is typically less than 40 nm, and is preferably less than 20 nm.

Upper memory material portion 122 is cup-shaped and contains a top electrode 128. A bit line 130 is formed over memory material structure 114 and in contact with top electrode 128. Top electrode 128 includes an inner portion 127, typically tungsten, surrounded by an electrically conductive interface layer 129, typically titanium nitride, the interface layer contacting upper memory material portion 122.

Memory cell array 100 also includes polysilicon word lines 134 between contact 108 and drain regions 136 within substrate 138 and beneath contacts 108. Common source lines 140 are positioned between word lines 134 and contact common source regions 142 within substrate 138. Word lines 134 are covered by silicide caps 144. Word lines 134 and caps 144 are covered by a dielectric layer 145. Isolation trenches 146 separate the two transistor structures 148 from adjacent two transistor structures. In this example transistors act as the access devices. Other access devices, such as diodes, may also be used.

Figure 4:
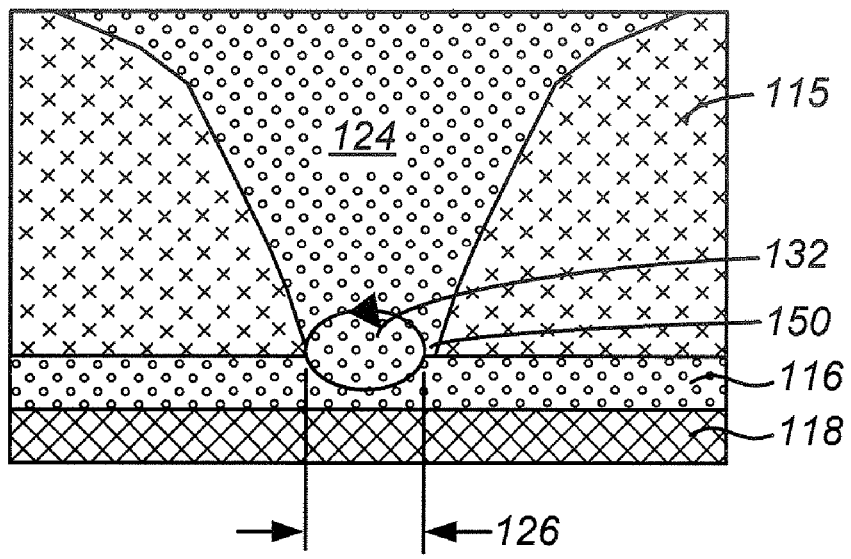
FIG. 4 is a simplified, enlarged view of a portion of the memory cell device of FIG. 3 showing the phase change region at the intersection of the memory material element and the lower memory material layer.

FIG. 4 is a simplified, enlarged view of a portion of memory cell layer 106 of FIG. 3. In this example memory material element 124 uses a phase change material as the memory material. This results in a phase change region 132 being created where the temperature within memory material structure 114 is the highest. The downwardly tapering shape of memory material element 124, which may be somewhat exaggerated in FIG. 4, creates a constricted region 150 at its lower end at the interface with lower memory material layer 116. Memory material element has a minimum lateral dimension 126 at this interface. It is at this interface that phase change region 132 develops during use so that the lateral dimension of phase change region 132 is lateral dimension 126.

Figure 5:
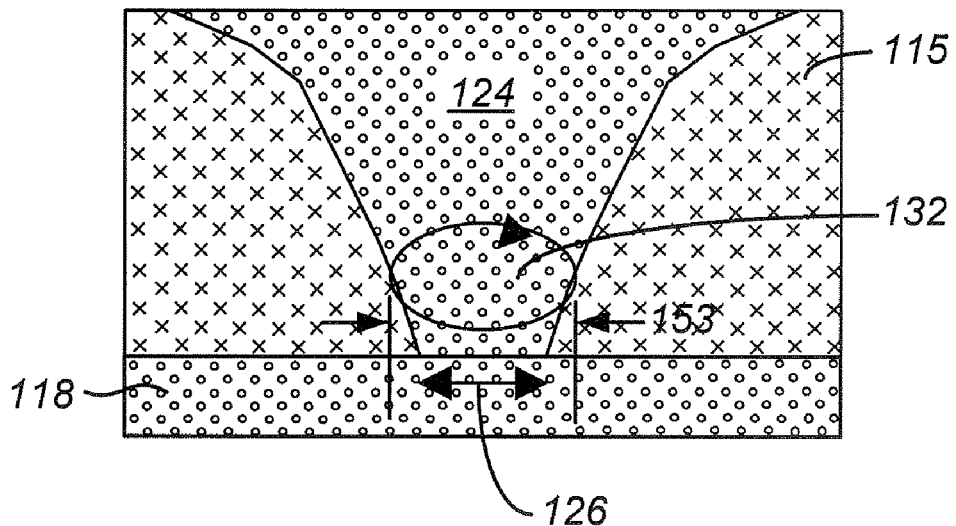
FIG. 5 is a view similar to that of FIG. 4 showing a prior art structure lacking the lower memory material layer of FIG. 4.

In contrast, prior art structures, shown in FIG. 5, do not use lower memory material layer 116 between memory material element 124 and the electrode structure, in this case bottom electrode 118 and contact 108. The electrode structure acts as a heat sink causing phase change region 132 to move upwardly away from bottom electrode 118 so that the lateral dimension 153 of the phase change region 132 of FIG. 5 is substantially larger than the corresponding lateral dimension 126 of the phase change region 132 of FIG. 4. This results in the need for more energy to be delivered to the memory cell of FIG. 5 compared with the memory cell of FIG. 4 to produce the desired phase change transition; the need for more energy can result in reliability problems.

Figure 6:
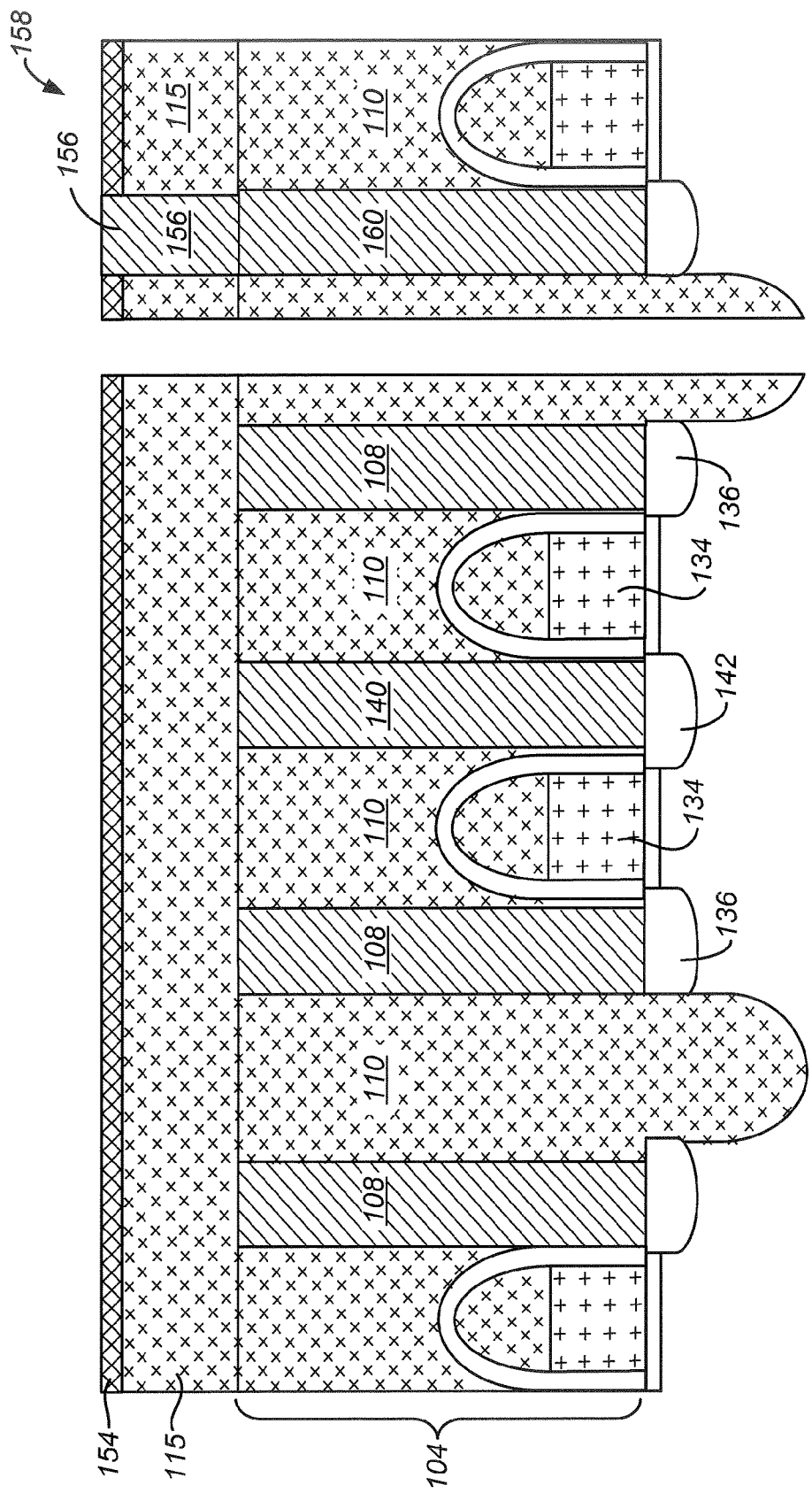
FIGS. 6-14 illustrate exemplary steps in the manufacture of the memory cell array of FIG. 3.
Figure 7:
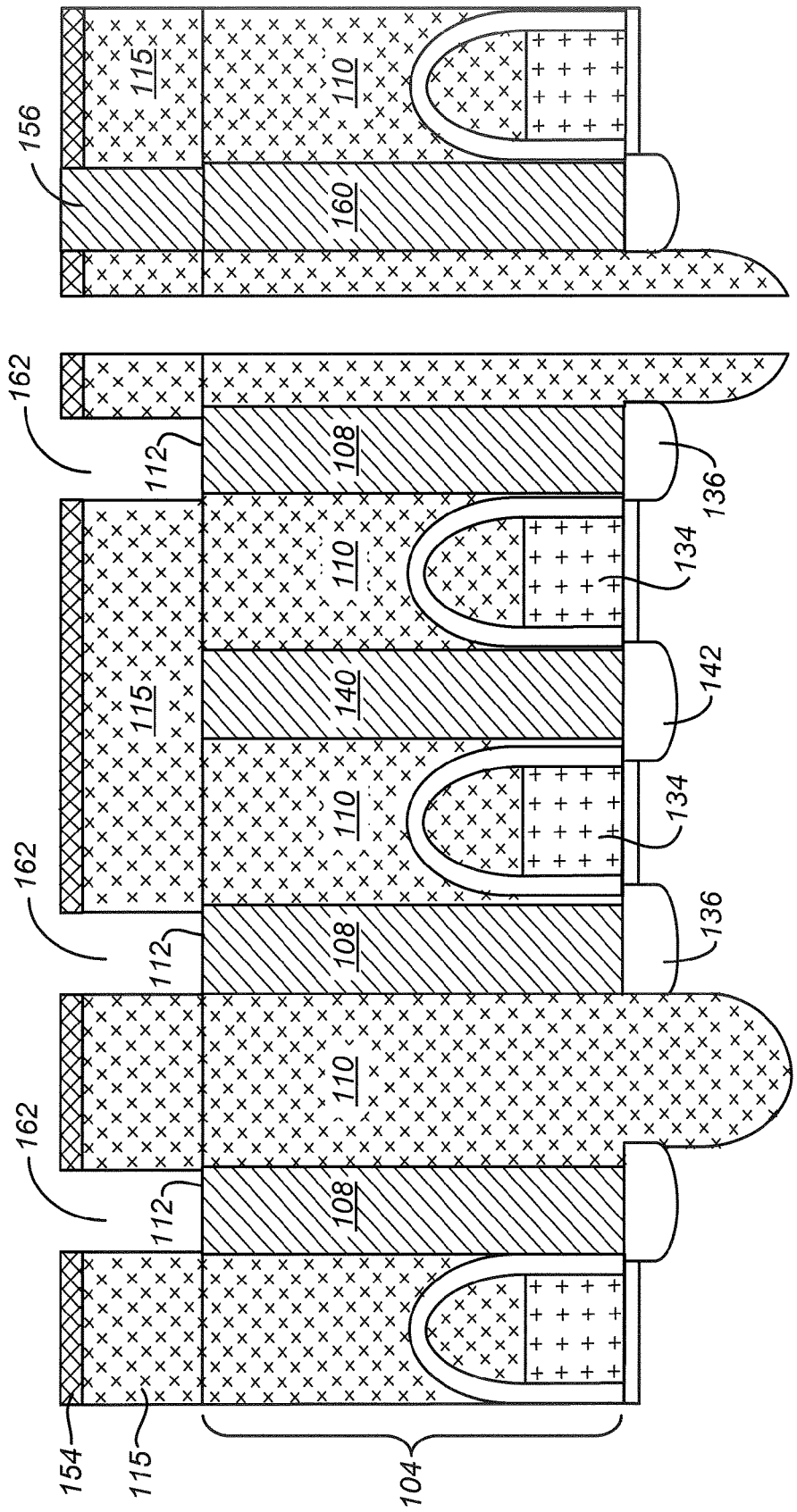

FIGS. 6-14 illustrate exemplary steps during the manufacture of memory cell array 100. FIG. 6 illustrates memory cell access layer 104 having dielectric material 115, typically silicon dioxide, deposited thereon. This is followed by deposition of a layer of an interface dielectric material 154, such as silicon nitride. A via is formed through layer 154 and dielectric material 115 at the periphery 158 of memory cell layer 100 to open onto a plug 160 within memory cell access layer 104. The via is then filled with electrode material to create a plug 156 contacting plug 160. FIG. 7 illustrates forming vias or openings 162 through layer 154 and dielectric material 115 to expose surfaces 112 of contacts 108.

Figure 8:
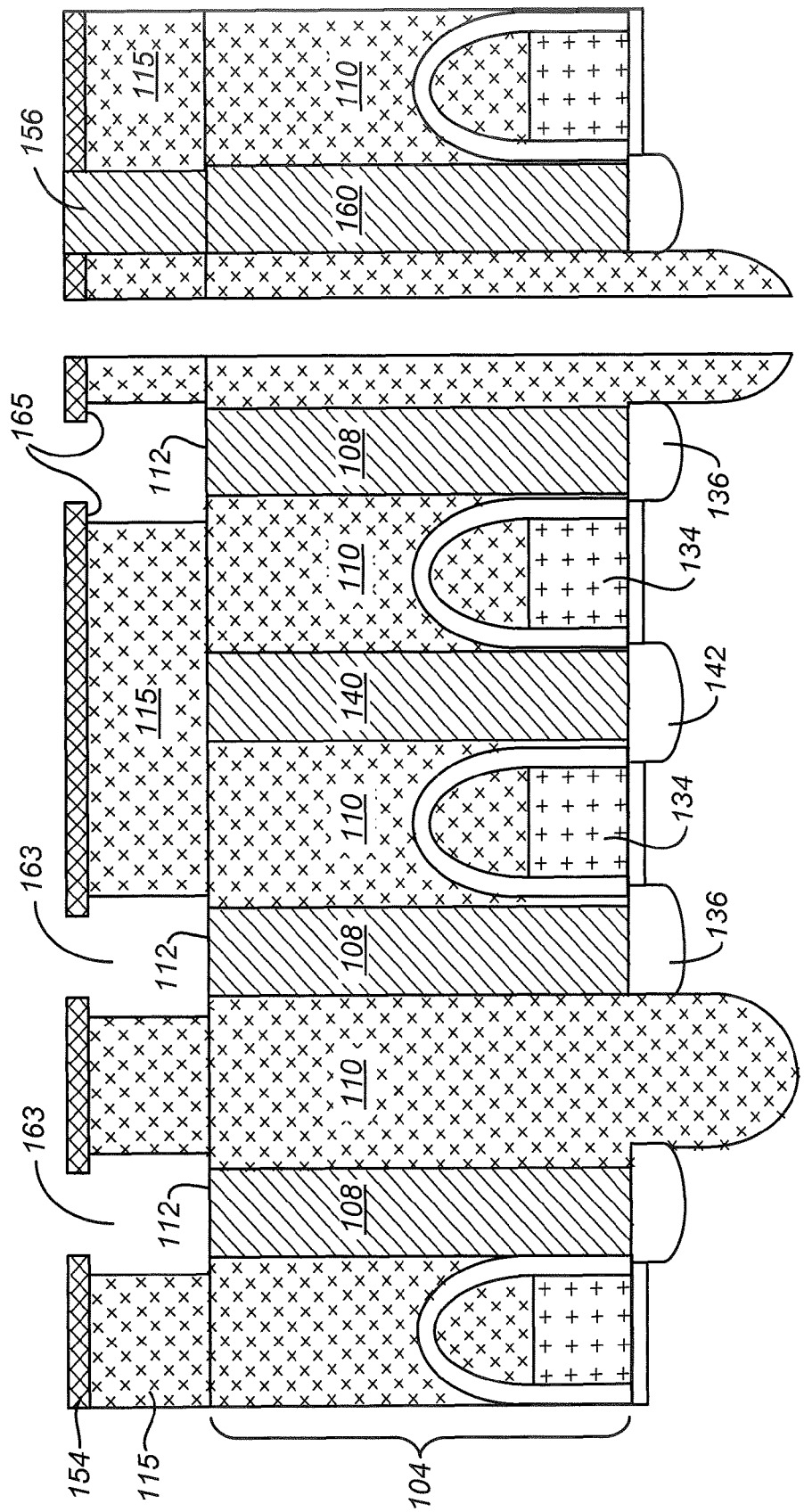

FIG. 8 shows the subassembly of FIG. 7 after a second etch process is used to selectively remove ("etch back") additional dielectric layer 115 material to form enlarged, keyhole vias 163 and to form overhanging portions 165 of interface dielectric material layer 154. In this example, this etch process is a selective isotropic etch that etches dielectric layer 115, comprising for example silicon dioxide, but does not significantly etch layer 154, comprising for example silicon nitride, such as a buffered HF wet-chemical etch or a non-directional plasma etch. Vias 163 have walls 167 which in the illustrated embodiment of FIG. 8 are essentially vertical. In some alternative embodiments walls 167 of vias 163 are other than vertical, including for example walls 167 having a bowed shape.

Figure 9:
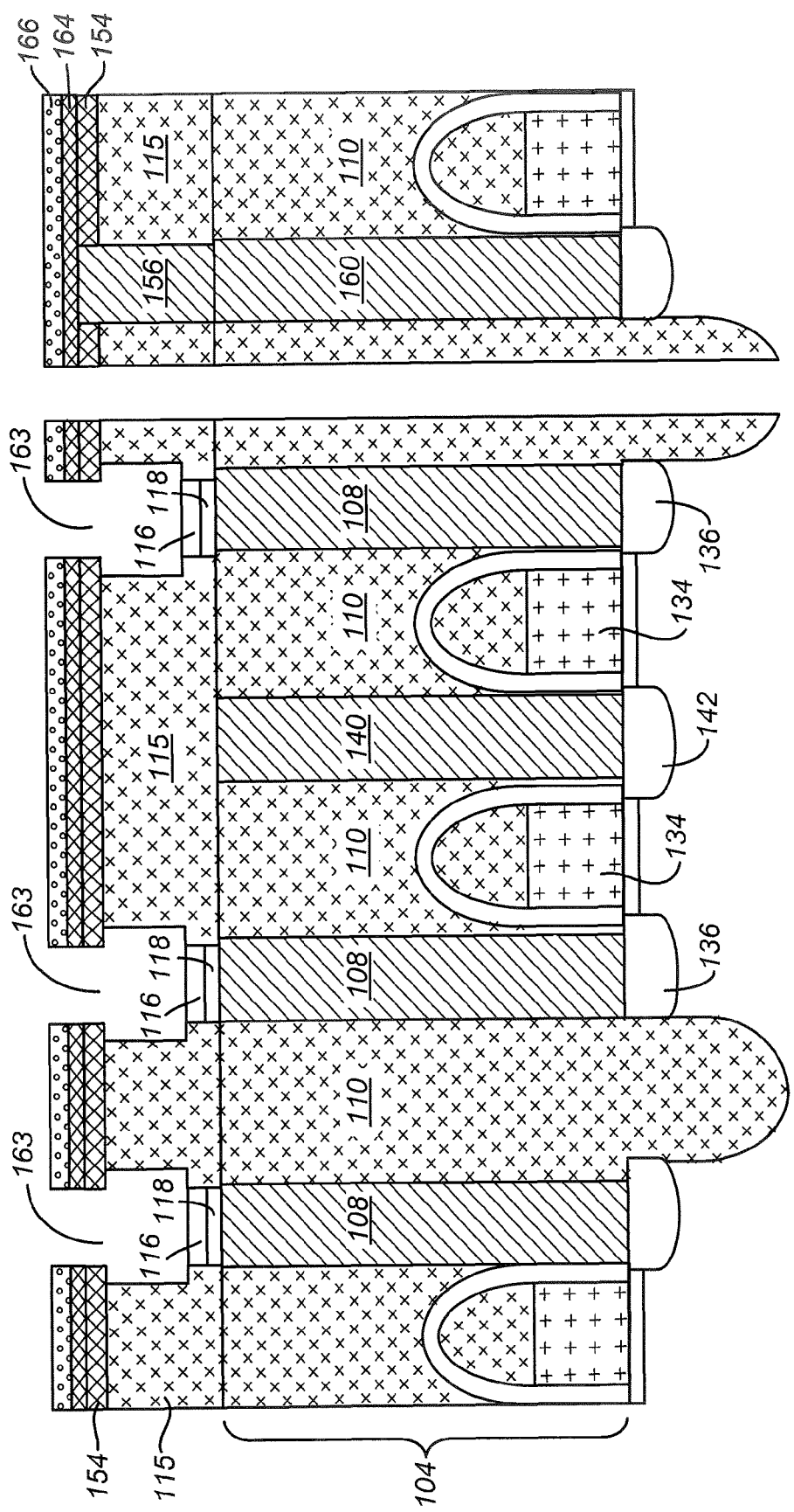
Figure 10:
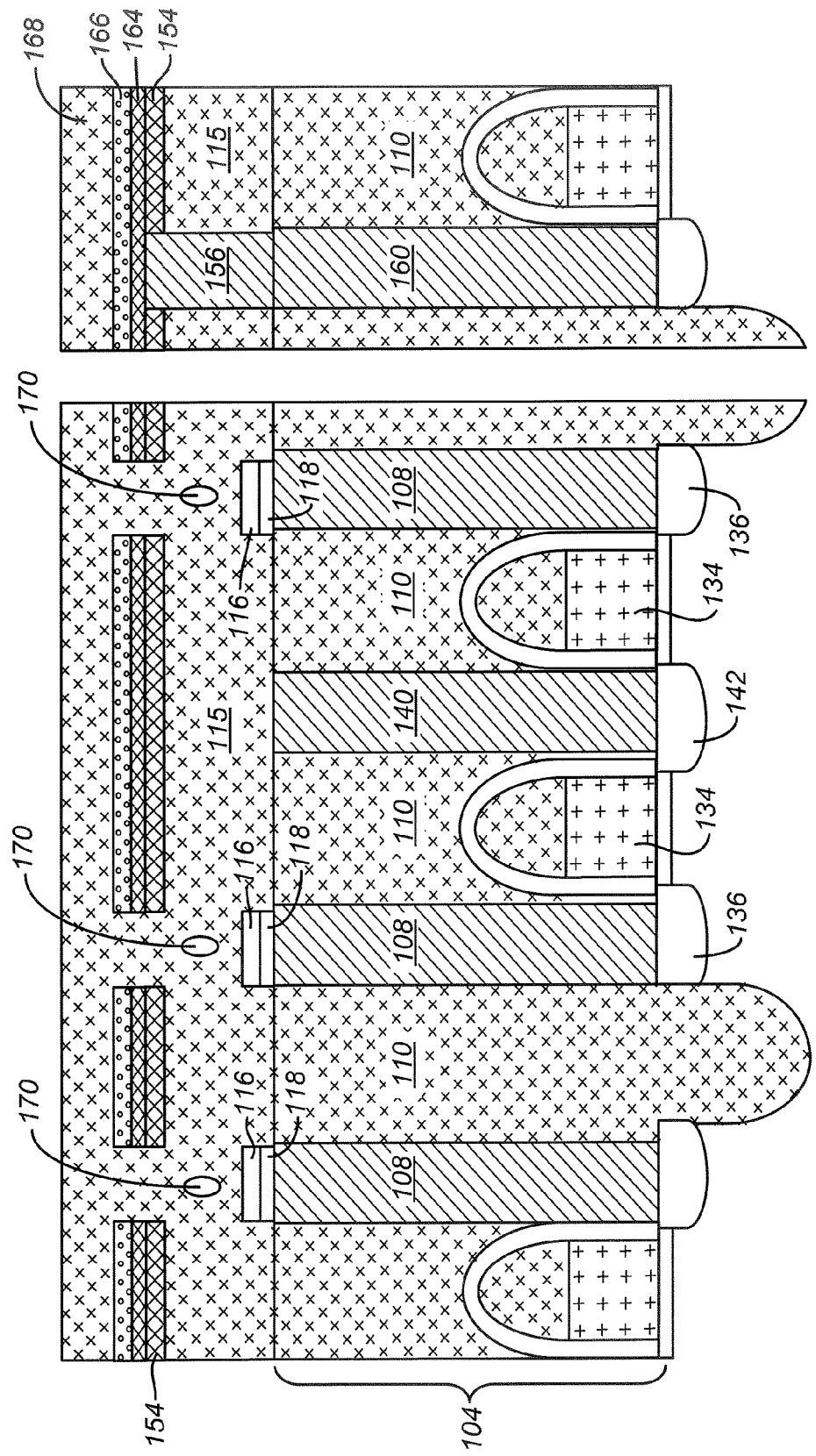

At FIG. 9 the result of the deposition of an electrically conductive interface material 164, such as titanium nitride, onto the structure of FIG. 8 is illustrated. The electrically conductive interface material creates the bottom electrodes 118 of FIG. 3. On top of interface material 164 a memory material layer 166 is deposited. A portion of memory material layer 166 deposited on bottom electrode 118 creates lower memory material layer 116. FIG. 10 shows a result of a dielectric material deposition step in which a dielectric material 168, such as silicon dioxide, is deposited onto the structure of FIG. 9. The process used is preferably a conformal oxide deposition technique resulting in a sub lithographically sized pore or void 170 within the opening 162 centered above lower memory material layer 116. The creation of sub lithographically sized voids 170 is aided by the creation of keyhole vias 163.

Figure 11:
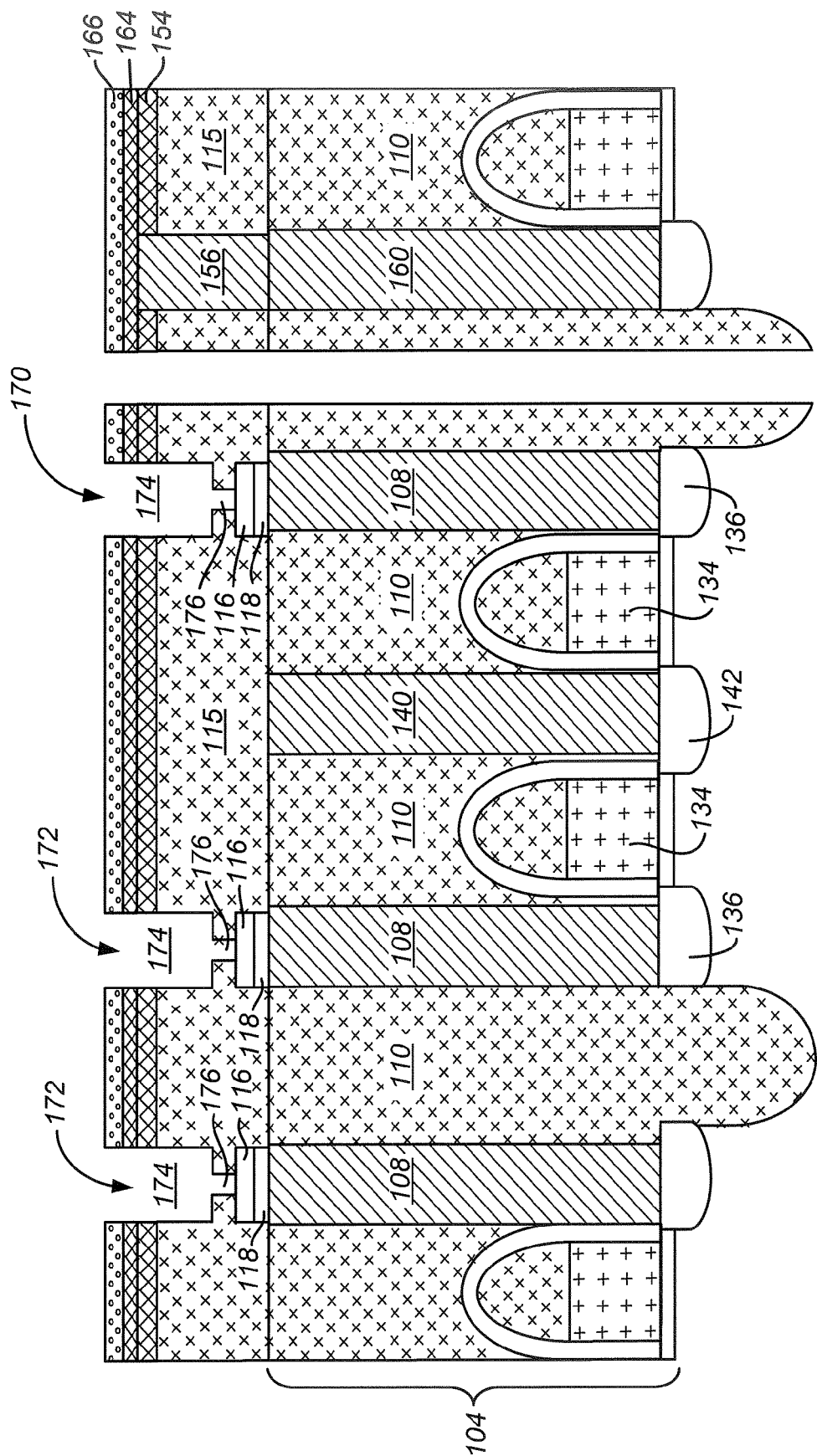

FIG. 11 illustrates the results of an etching step removing most of oxide material 168 and creating etched openings 172 above lower memory material layer 116. Openings 172 include a larger, upper open region 174 and a smaller, constricted lower open region 176. Constricted open region 176 opens onto lower memory material layer 116. The configuration of etched openings 172 is largely a result of the existence of voids 170 created during the dielectric material deposition step of FIG. 10. Open region 174 is typically a minimum lithographically sized open region so that open region 176 is a sub lithographically sized open region. In some examples open region 174 has a lateral dimension of about 65 to 22 nm, typically about 45 nm, and open region 176 has a lateral dimension of about 30 to 10 nm, typically about 20 nm.

Figure 12:
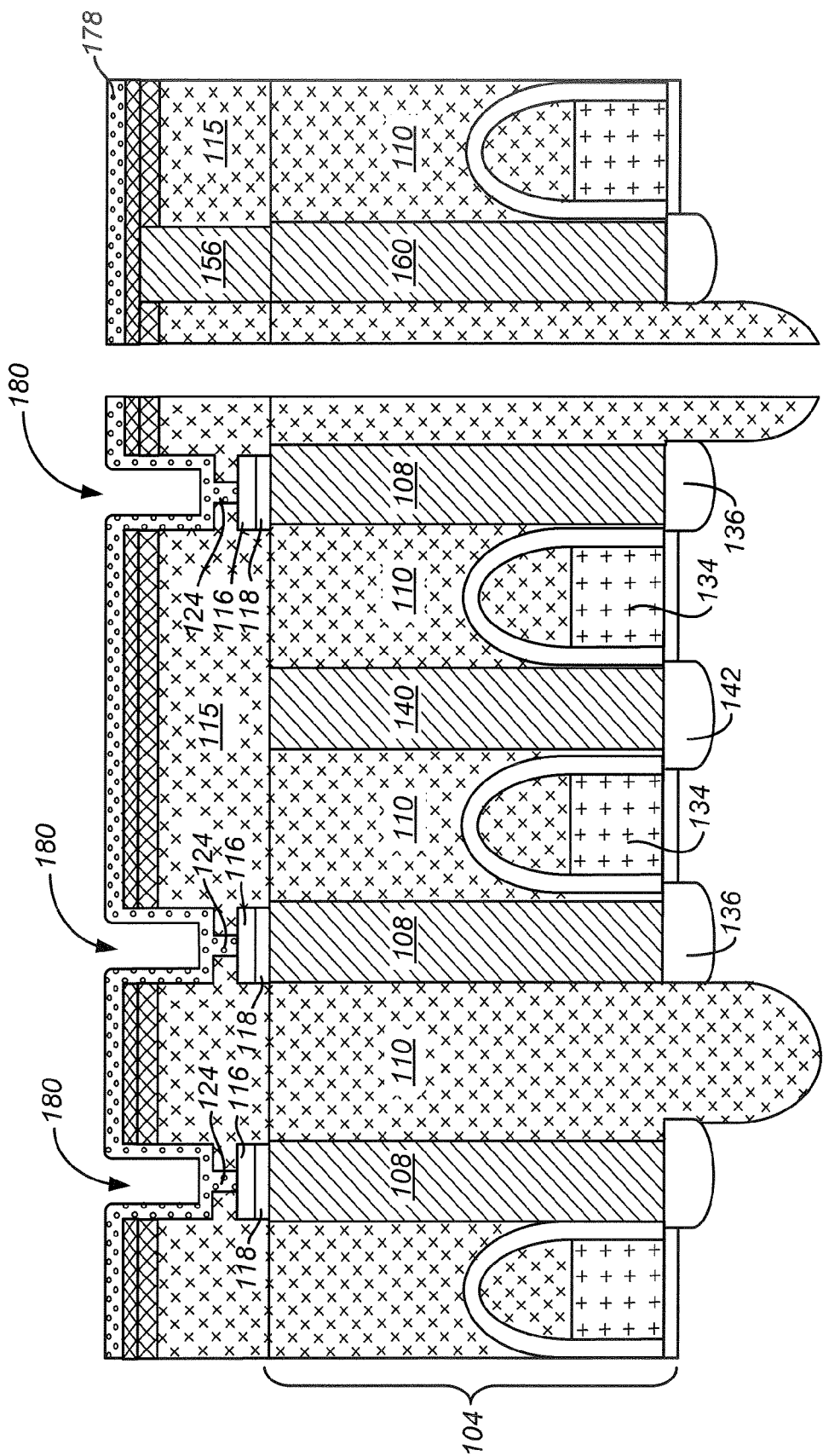
Figure 13:
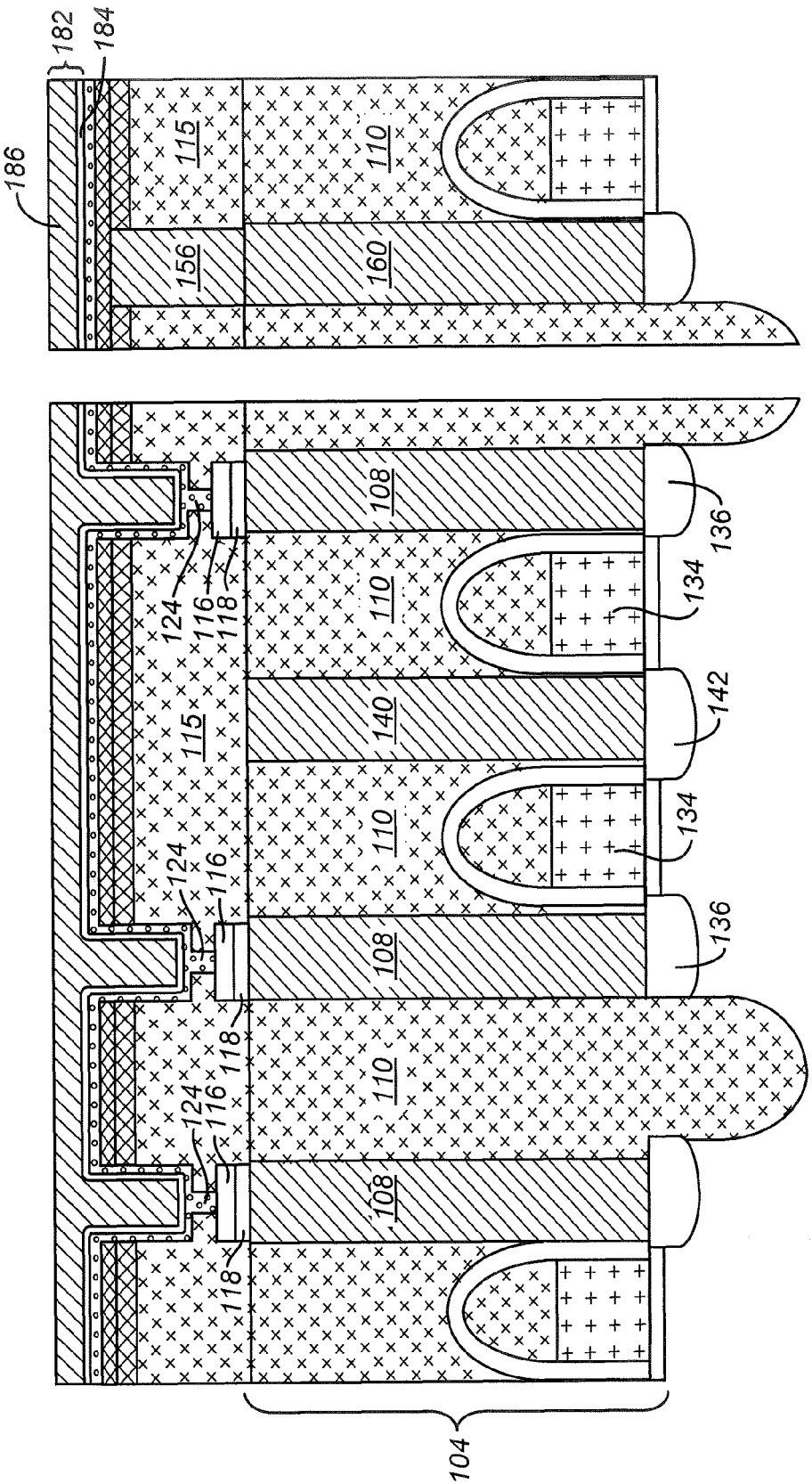
Figure 14:
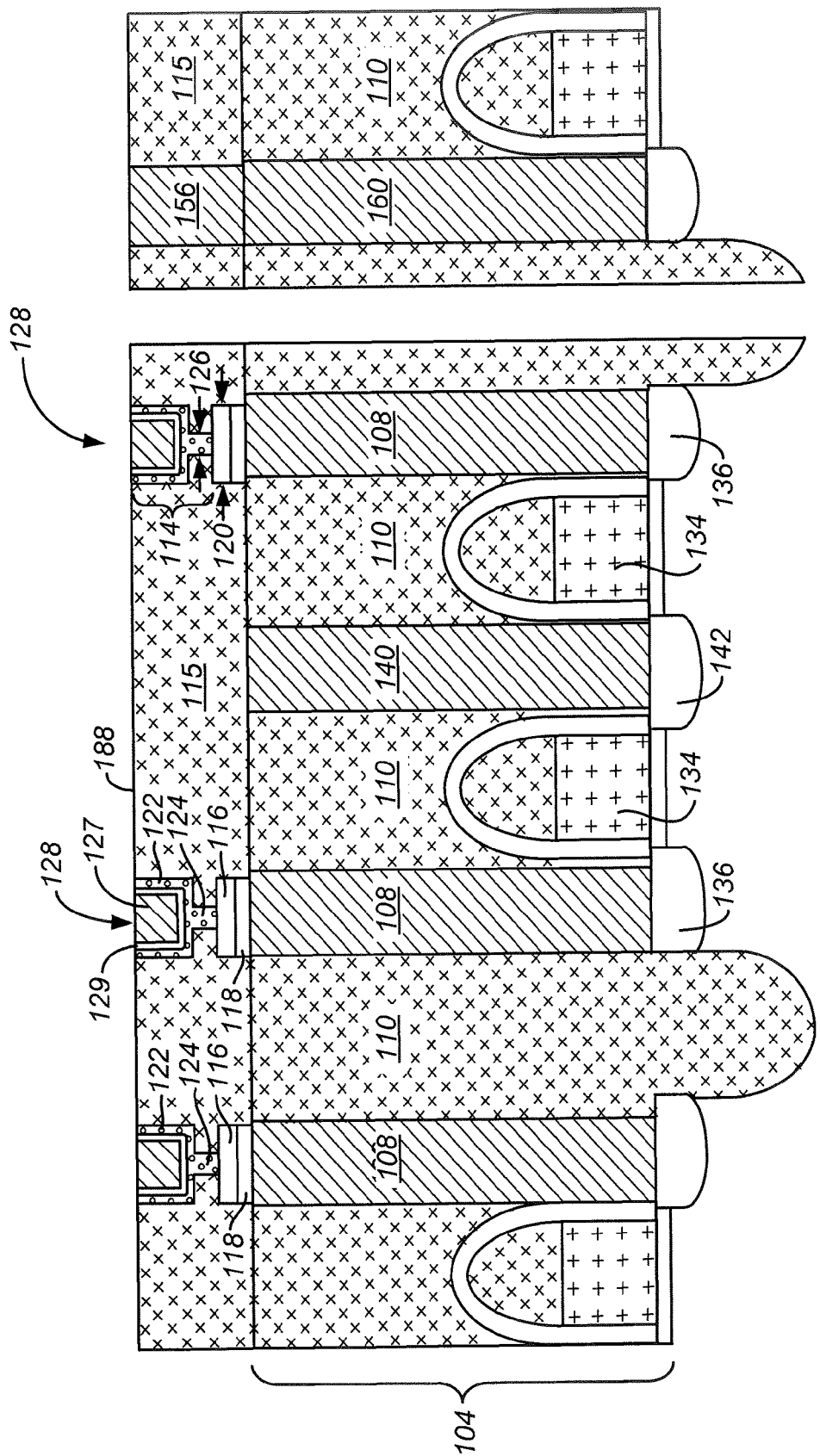

Next, as shown in FIG. 12, a layer of memory material 178, typically a phase change memory material such as GST, is deposited on the structure of FIG. 11. The deposition process fills constricted open region 176 and lines the walls of upper open region 174 to create a memory material opening 180. In FIG. 13 an electrode material layer 182 is deposited on memory material layer 178 of FIG. 12. Electrode material layer 182 includes an interface electrode layer 184, typically titanium nitride when memory material layer 178 is GST, and a main electrode layer 186, typically tungsten. The structure of FIG. 13 is then planarized, typically by a chemical mechanical polishing process, to create the structure of FIG. 14 with a planarized upper surface 188. Bit lines 130 are then formed on the structure of FIG. 14 resulting in the memory cell array 100 of FIG. 3.

One aspect of the present invention is the recognition that memory material element 124 typically has a minimum lateral dimension at its lower end, the end adjacent to the bottom electrode. To help ensure that phase change region 132 occurs at the minimum lateral dimension of memory material element 124, a thermal barrier in the form of lower memory material layer 116 is used between memory material element 124 and the bottom electrode.

Other types of conductors can be used for contact 108, top electrode 128 and bit line 130, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O.

The dielectric materials may comprise electrical insulators including one or more elements selected from the group consisting of Si, Ti, Al, Ta, N, O, and C. In some examples, the dielectric materials have a low thermal conductivity, less than about 0.014 J/cm*K*sec. In other examples, when memory material structure 114 is made from a phase change material, thermally insulating dielectric material 115 has a thermal conductivity less than that of the amorphous state of the phase change material, or less than about 0.003 J/cm*K*sec for a phase change material comprising GST. Representative thermally insulating materials include materials that are a combination of the elements silicon Si, carbon C, oxygen O, fluorine F, and hydrogen H. Examples of thermally insulating materials which are candidates for use for the thermally insulating dielectric materials include $SiO_2$, SiCOH, polyimide, polyamide, and fluorocarbon polymers. Other examples of materials which are candidates for use for the thermally insulating dielectric materials include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within dielectric material layers can provide thermal and electrical insulation.

Useful characteristics of a programmable resistive type of memory material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. In following sections of the disclosure, the phase change or other memory material is often referred to as GST, and it will be understood that other types of phase change materials can be used. A material useful for implementation of a memory cell as described herein is $Ge_2Sb_2Te_5$.

A memory cell device 102 as described herein is readily manufacturable using standard lithography and thin film deposition technologies, without requiring extraordinary steps to form sub-lithographic patterns, while achieving very small dimensions for the region of the cell that actually changes resistivity during programming. In embodiments of the invention, the memory material may be a programmable resistive material, typically a phase change material, such as $Ge_2Sb_2Te_5$ or other materials described below. The region in the memory material element 124 that changes phase is small; and accordingly, the magnitude of the reset current required for changing the phase is very small.

Embodiments of memory cell device 102 include phase change based memory materials, including chalcogenide based materials and other materials, for memory material element 124. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

The following are short summaries describing four types of resistive memory materials.

1. Chalcogenide Material $Ge_xSb_yTe_z$ x:y:z=2:2:5

Or other compositions with x:0~5; y:0~5; z:0~10

GeSbTe with doping, such as N—, Si—, Ti—, or other element doping may also be used.

Formation method: By PVD sputtering or magnetron-sputtering method with reactive gases of Ar, $N_2$, and/or He, etc chalcogenide @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.

The post deposition annealing treatment with vacuum or N2 ambient is sometimes needed to improve the crystallize state of chalcogenide material. The annealing temperature typically ranges 100 C to 400 C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

2. CMR (Colossal Magneto Resistance) Material $Pr_xCa_yMnO_3$ x:y=0.5:0.5

Or other compositions with x:0~1; y:0~1

Another CMR material that includes Mn oxide may be used

Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.

The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.

The thickness of CMR material depends on the design of cell structure. The CMR thickness of 10 nm to 200 nm can be used to be the core material.

A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-Element Compound $Ni_xO_y$; $Ti_xO_y$; $Al_xO_y$; $W_xO_y$; $Zn_xO_y$; $Zr_xO_y$; $Cu_xO_y$; etc x:y=0.5:0.5

Other compositions with x:0~1; y:0~1

Formation method:

1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.

2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.

3. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer Material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

For additional information on the manufacture, component materials, use and operation of phase change random access memory devices, see U.S. patent application Ser. No. 11/155,067, filed 17 Jun. 2005, entitled Thin Film Fuse Phase Change Ran And Manufacturing Method.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

Is preferred that all or part of the portions of the bottom and top electrodes contacting memory material structure 114 comprise an electrode material, such as TiN, or another conductor selected for compatibility with the phase change material of the memory material structure. In the embodiment of FIG. 3, bottom electrode 118 and interface layer 129 are made of TiN while the remainder of the bottom and top electrodes comprises tungsten. The electrical contact enhancement material of bottom electrode 118 and interface layer 129 may also include other electrical contact enhancement materials such as TaAlN, WAlN or TiAlN. Other types of conductors can be used for the plug structures and the top and bottom electrodes structures, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O. TiN may be preferred because it makes good contact with GST (discussed above) as memory material element 16, it is a common material used in semiconductor manufacturing, and it provides a good diffusion barrier at the higher temperatures at which GST transitions, typically in the 600-700° C. range.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. For example, Any and all patents, patent applications and printed publications referred to above are hereby incorporated by reference.

What is claimed is:

1. A memory cell device comprising:

a memory cell access layer comprising an electrical contact, the electrical contact having an electrical contact surface;

a dielectric material over the memory cell access layer;

a memory material structure within the dielectric material comprising:

a lower memory material layer overlying at least a substantial portion of the electrical contact surface and electrically coupled to the electrical contact, the lower memory material layer having an average lateral dimension;

an upper memory material portion spaced apart from the lower memory material layer, the upper memory material portion overlying at least a substantial portion of the lower memory material layer;

a memory material element electrically connecting the upper memory material portion with the lower memory material layer, the memory material element defining an electrical property state change region therein, the memory material element having a minimum lateral dimension, the minimum lateral dimension being substantially less than the average lateral dimension; and the upper memory material portion being a cup-shaped upper memory portion defining a memory material opening therein; and a top electrode in electrical contact with the upper memory material portion.

2. The memory cell device according to claim 1 further comprising a bottom electrode, acting as an electrically conductive interface layer, contacting the lower memory material layer and the electrically conductive surface.

3. The memory cell device according to claim 2 wherein the bottom electrode overlies effectively the entire electrical contact surface.

4. The memory cell device according to claim 1 wherein the minimum lateral dimension of the memory material element is less than 40 nm.

5. The memory cell device according to claim 1 wherein the minimum lateral dimension of the memory material element is less than 20 nm.

6. The memory cell device according to claim 1 wherein the average lateral dimension of the lower memory material layer is about 10 nm to 40 nm.

7. The memory cell device according to claim 1 wherein the average lateral dimension of the lower memory material layer is at least three times the minimum lateral dimension of the memory material element.

8. The memory cell device according to claim 1 wherein the average lateral dimension of the lower memory material layer is at least four times the minimum lateral dimension of the memory material element.

9. The memory cell device according to claim 1 wherein the memory material element is a tapered structure tapering down to a smaller cross-sectional area adjacent to the lower memory material layer, whereby the electrical property state change region is at the junction of the memory material element and the lower memory material layer.

10. The memory cell device according to claim 1 wherein the top electrode is at least partially housed within the memory material opening.

11. The memory cell device according to claim 10 further comprising an electrically conductive interface layer between the cup-shaped upper memory material portion and the top electrode.

12. The memory device of claim 1, wherein the memory material element comprises a combination of two or more materials from the group of Ge, Sb, Te, Se, In, Ti, Ga, Bi, Sn, Cu, Pd, Pb, Ag, S, and Au.

13. A memory cell device comprising:
a memory cell access layer comprising an electrical contact, the electrical contact having an electrical contact surface;
a dielectric material over the memory cell access layer;
a memory material structure within the dielectric material comprising:
a lower memory material layer overlying at least a substantial portion of the electrical contact surface and electrically coupled to the electrical contact, the lower memory material layer having an average lateral dimension;
an upper memory material portion spaced apart from the lower memory material layer, the upper memory material portion overlying at least a substantial portion of the lower memory material layer;
a memory material element electrically connecting the upper memory material portion with the lower memory material layer, the memory material element defining an electrical property state change region therein, the memory material element having a minimum lateral dimension, the minimum lateral dimension being substantially less than the average lateral dimension; and
the memory material element being a tapered structure tapering down to a smaller cross-sectional area adjacent to the lower memory material layer, whereby the electrical property state change region is at the junction of the memory material element and the lower memory material layer; and
a top electrode in electrical contact with the upper memory material portion.

* * * * *